(12) United States Patent
Katsap (10) Patent No.: US 11,901,154 B1
(45) Date of Patent: Feb. 13, 2024

(54) CONICAL HEAT SHIELD FOR ELECTRON EMITTING CATHODE

(71) Applicants: NuFlare Technology, Inc., Kanagawa (JP); NuFlare Technology America, Inc., Sunnyvale, CA (US)

(72) Inventor: Victor Katsap, Hopewell Junction, NY (US)

(73) Assignees: NuFlare Technology, Inc., Kanagawa (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 18/178,249

(22) Filed: Mar. 3, 2023

(51) Int. Cl.
*H01J 1/15* (2006.01)
*H01J 37/065* (2006.01)
*H01J 37/075* (2006.01)

(52) U.S. Cl.
CPC .......... *H01J 37/065* (2013.01); *H01J 37/075* (2013.01)

(58) Field of Classification Search
CPC .......... H01J 37/065; H01J 37/075; H01J 1/13; H01J 9/02; H01J 1/15
See application file for complete search history.

(56) References Cited

U.S. PATENT DOCUMENTS

2012/0098409 A1* 4/2012 Dou ............... H01J 37/065
313/341

OTHER PUBLICATIONS

Busbaher, Daniel, "Thermal Management: Effect of Heat Shielding Using Thin Metal Cylinders on a Dispenser Cathode Temperature", Abstract, p. 3-15, 2 pages.

* cited by examiner

*Primary Examiner* — Donald L Raleigh
(74) *Attorney, Agent, or Firm* — Oblon, McClelland, Maier & Neustadt, L.L.P.

(57) ABSTRACT

An electron emission cathode which includes a base, a heater connected to the base, an electron emitter connected to the heater at a mounting location distal to the base, and a conical heat shield surrounding a portion of the heater, having a truncated cone shape comprising a narrow end oriented toward the base and a wide end oriented toward the electron emitter. The conical heat shield is configured to reflect heat radiated by the heater toward the electron emitter. The conical heat shield reduces an overheating required to bring the electron emitter to an emission temperature and reduces a heating power required to operate the cathode.

20 Claims, 8 Drawing Sheets

CONICAL HEAT SHIELD FOR ELECTRON EMITTING CATHODE

BACKGROUND

Field

This disclosure generally relates to conical heat shield for use in an electron emitting thermionic cathode assembly, often used in electron microscopes and electron beam lithography tools.

Description of the Related Art

The scanning electron microscope (SEM), transmission electron microscope (TEM), and electron beam lithography tool each require an electron gun with electron emission source, which generates an electron beam used to strike a target material. A wide variety of electron guns are available, utilizing different materials and techniques for producing an electron beam. Typically, the electron gun may be in the category of FEG, or field emission gun, using thermal field effect emitters, which use a high strength electric field to reduce the work function of a heated electron emitter, or in the category of thermionic emitters, which use high temperature to facilitate electron emission.

For example, a Schottky TFE source contains a single-crystal tungsten wire with a very sharp tip and a zirconium reservoir around the tungsten wire. The tip is mounted on a hairpin filament, which is used to maintain the tip at a temperature of 1750 K to 1850 K during use.

This assembly is mounted onto a ceramic base and two electrodes are added. The first electrode is a suppressor having an aperture surrounding the tungsten wire. The second electrode is an extractor having an aperture just above the tip of the wire. The tip protrudes through the suppressor aperture and faces the extractor, which may be considered as an anode in a classical triode gun comprised of the Schottky tip, suppressor, and extractor. Electrons are emitted from the tip due to both thermal excitation and the electrical field at the tip. The tip radius typically ranges from 0.3 microns to 1.0 microns. The extractor central bore is typically 0.5 microns from the tip.

Another example particularly relevant to the present application is a thermionic electron source. Thermionic sources contain a tip made from crystalline (typically single-crystal) electron emissive material. The most common electron emissive material used in thermionic sources is Lanthanum hexaboride ($LaB_6$). The electron emissive material is mounted at the tip of a heater, typically a carbon rod connected at the tip and split into to "legs" at an opposite end. The legs are connected to a voltage source and current can flow up one leg, through the connected tip near the electron emissive material, then down the other leg. This current causes resistive heating including of the tip of the heater. The heat is transferred to the electron emissive material, facilitating thermionic emission.

A significant disadvantage to the construction of conventional electron guns, particularly thermionic electron guns, is the imperfect transfer of heat from the heater to the electron emissive material resulting in inefficient temperature distribution. In order for the electron emissive material to reach the desired emission temperature, the heater must be raised to a temperature that is well above the desired emission temperature. Inefficiencies in heat transfer and heat loss, which is primarily due to radiative losses, and other components cause the required temperature difference between the heater and the electron emissive material to reach up to 200 K or more.

Figure 1A:
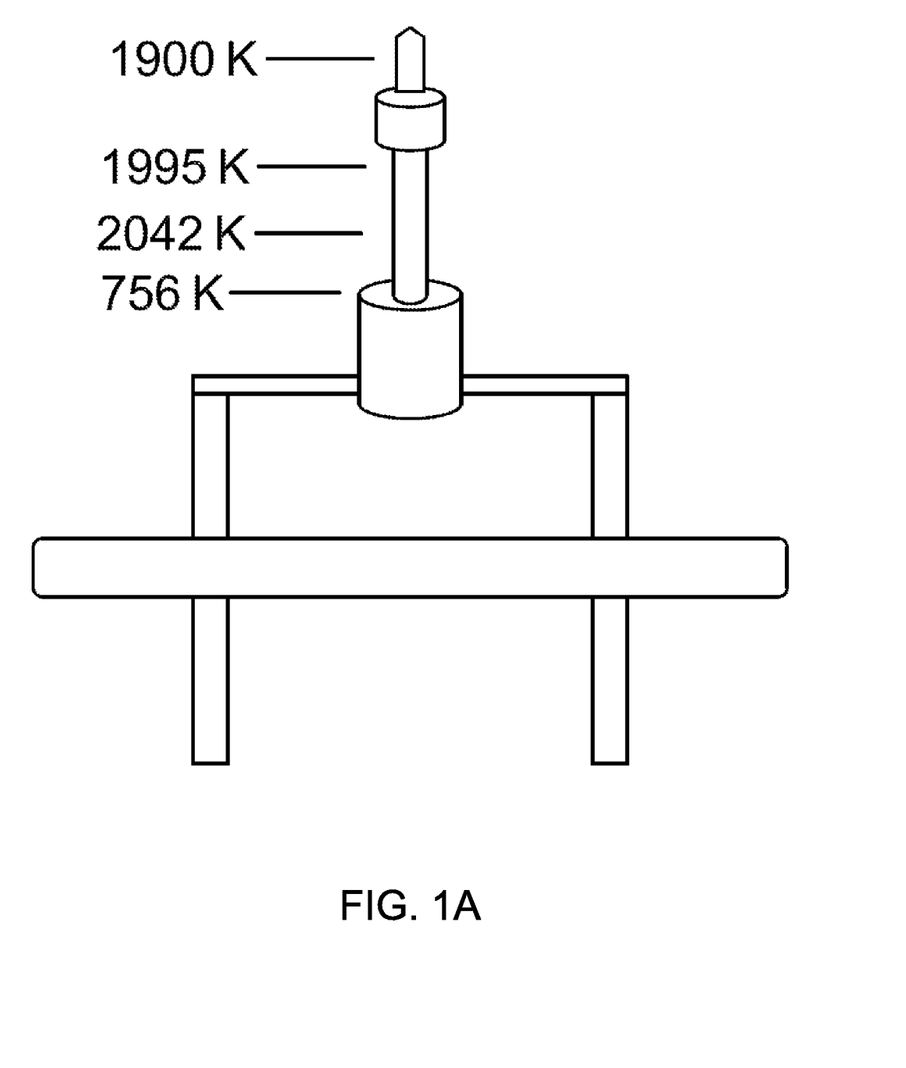
FIG. 1A depicts a conventional thermionic electron emission cathode showing different temperatures reached by different portions of the heater and emitter during operation.

FIG. 1A depicts a conventional thermionic electron emission cathode in which a carbon heater having a $LaB_6$ emissive material tip is mounted on a base and shows a typical temperature distribution across the cathode as measured by pyrometer. As shown in FIG. 1A, the approximate midpoint of the heater reaches a temperature of 2042 K (so-called hot spot), approximately 150 K higher than the electron emissive material at the tip of the heater, which has a temperature of 1900 K.

Figure 1B:
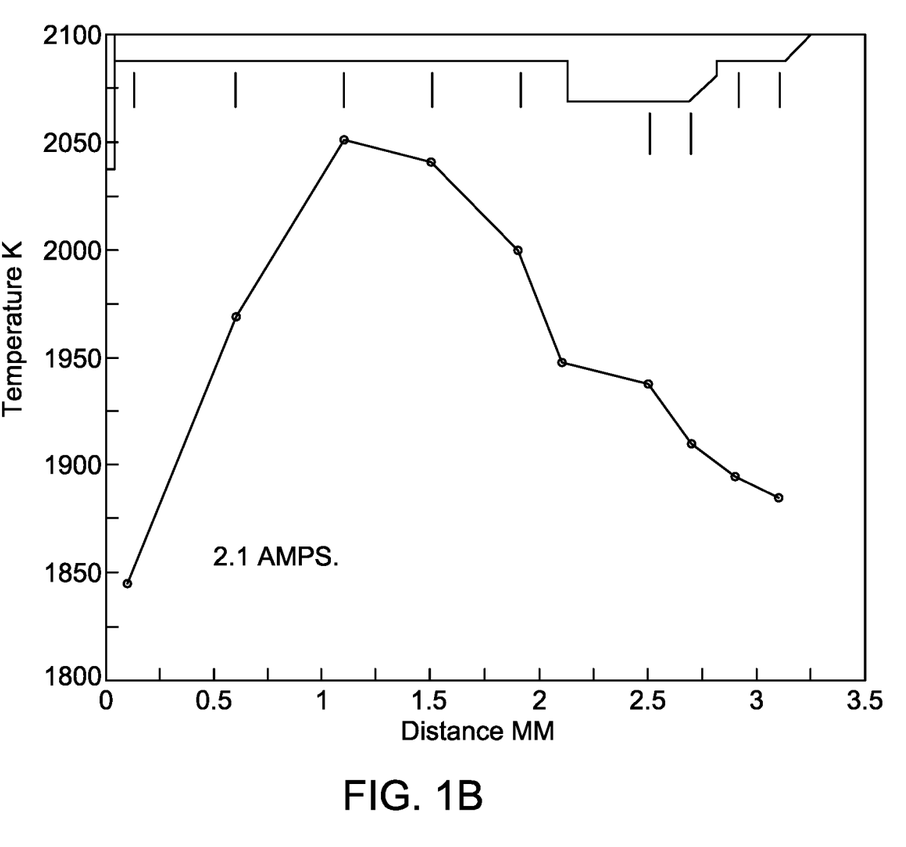
FIG. 1B shows an exemplary plot of the temperature profile for a conventional thermionic electron emission cathode along a length direction of the heater.

FIG. 1B shows a plot of the temperature profile of a conventional thermionic electron gun heater and electron emissive material. It is clear from FIGS. 1A and 1B that the maximum temperature does not occur at the location where the heat is actually needed (i.e., the electron emissive material), and in order to reach the desired temperature at that location, portions of the heater between the base and the emitter must be overheated above the temperature desired at the tip. This is a distinct inefficiency. Moreover, the hot spot located approximately in the middle of the heater causes excessive evaporation and recrystallization of the heater, thus reducing its service life.

Placing an insulating shield around a heater can decrease the radiative losses and reduce the heat transfer in undesirable directions. For example, Busbaher investigated placing a cylindrical heat shield around large cathodes having diameters ranging from 0.125 inches (~3.175 mm) to 0.450 inches (~11.43 mm) and found that the cylindrical heat shield could raise cathode temperature for a given heating power [Busbaher, D., "Thermal management: Effect of heat shielding using thin metal cylinders on a dispenser cathode temperature," IEEE International Vacuum Electronics Conference, 2008, pp. 344-345]. This cylindrical heat shield, however, did not change the heating distribution of the heater or the cathode along the length (longitudinal axis) and did not decrease the required overheating to reach cathode temperature.

Accordingly, it is one object of the present disclosure to provide an electron emitting thermionic cathode, particularly useful in electron microscopes or electron beam lithography tools that contain a conical heat shield surrounding the heater. This conical heat shield serves to reduce the required temperature difference between the heater and the electron emissive material, to smooth over the hot spot, and to re-distribute temperature along the heater in more efficient way

SUMMARY

Embodiments of the present disclosure describe the integration of an electron gun (an electron emission cathode) and a conical heat shield that surrounds the heater and optionally the electron emitter at the tip of the heater. The heat shield is oriented so as to have a wide end near a tip of the heater and a narrow end near a base of the heater.

A first embodiment describes an electron emission cathode, comprising a base, a heater connected to the base, an electron emitter connected to the heater at a mounting location distal to the base, and a conical heat shield surrounding a portion of the heater, having a truncated cone shape comprising a narrow end oriented toward the base and a wide end oriented toward the electron emitter.

A second embodiment describes a method of forming an electron beam using the electron emission cathode comprising a base, a heater connected to the base, an electron emitter connected to the heater at a mounting location distal to the base, and a conical heat shield surrounding a portion of the heater, having a truncated cone shape comprising a narrow end oriented toward the base and a wide end oriented toward the electron emitter, the method comprising applying a voltage to the heater to cause the electron emitter to be heated to an emission temperature at which electrons are emitted, wherein a maximum heater temperature (hot spot) required to heat the electron emitter to the emission temperature is reduced by at least 100 K compared to an electron emission cathode lacking the conical heat shield.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Referring now to the drawings, wherein like reference numerals designate identical or corresponding parts throughout the several views.

Device and method of the present disclosure describe the integration of an electron gun (an electron emission cathode) and a conical heat shield which surrounds the heater and optionally the electron emitter at the tip of the heater. The heat shield is oriented so as to have a wide end near the tip of the heater and a narrow end near a base of the heater.

Figure 2A:
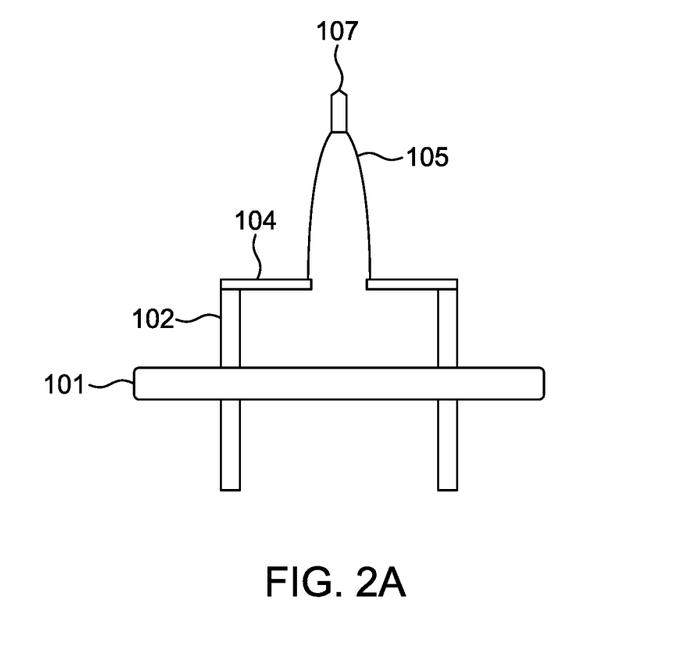
FIG. 2A shows an electron emission cathode having a wire-type heater according to an exemplary embodiment of the present disclosure with the conical heat shield removed for clarity.
Figure 2B:
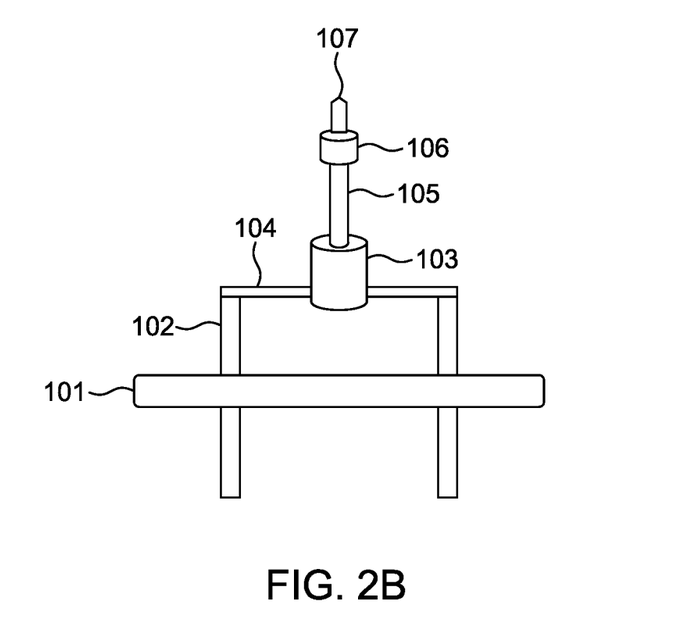
FIG. 2B shows an electron emission cathode having a rod heater according to an exemplary embodiment of the present disclosure with the conical heat shield removed for clarity.
Figure 2C:
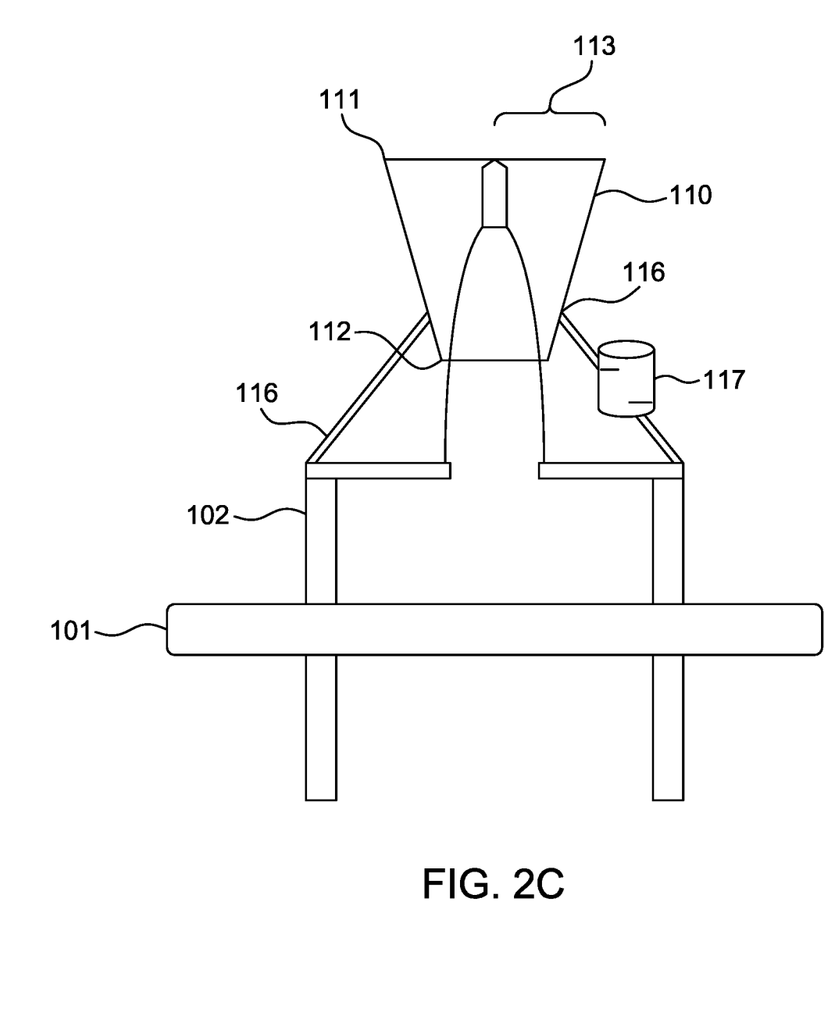
FIG. 2C shows an electron emission cathode having a wire-type heater according to an exemplary embodiment of the present disclosure with the conical heat shield in place.
Figure 2D:
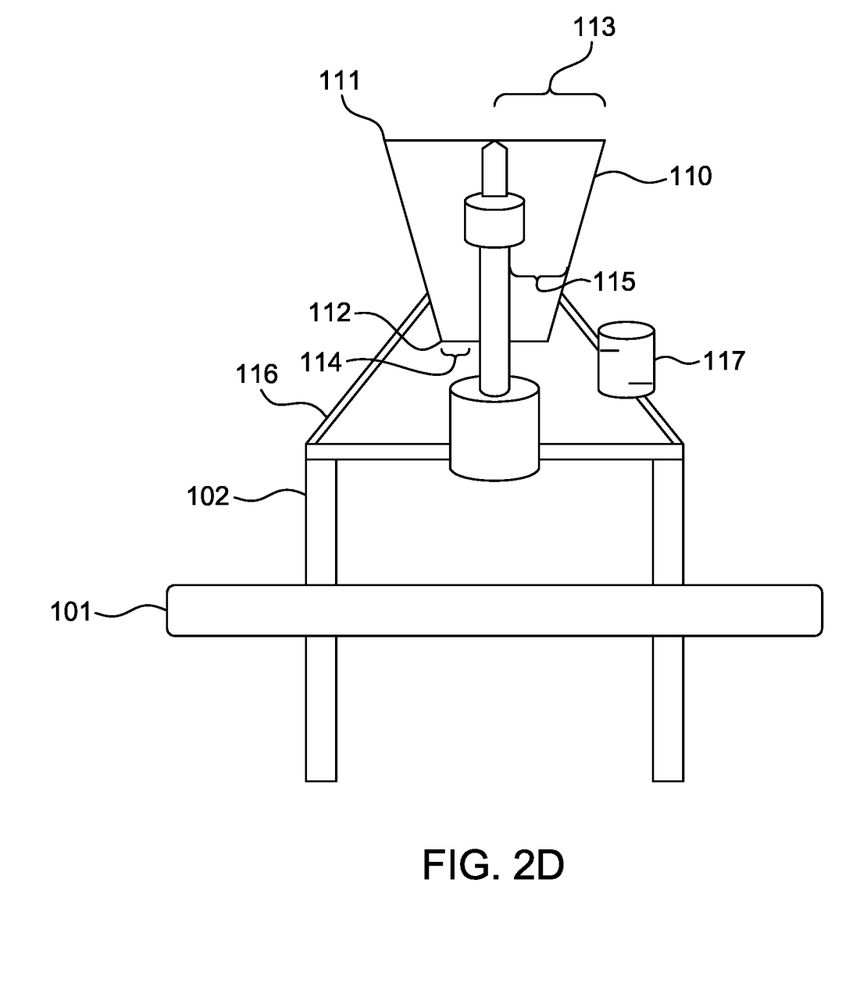
FIG. 2D shows an electron emission cathode having a rod heater according to an exemplary embodiment of the present disclosure with the conical heat shield in place.

FIGS. 2A-2D show a schematic depiction of the electron emission cathode according to an exemplary embodiment of the present disclosure. FIGS. 2A-2B show exemplary cathodes with the conical heat shield omitted for clarity in depicting components that may be blocked from view by the conical heat shield. FIGS. 2C-2D show exemplary cathodes with the heat shield in place.

As shown in FIGS. 2A-2D, the electron emission cathode includes a base 101. The base may be constructed of a suitable dielectric material. Preferably, the base is constructed of an insulating material that is capable of withstanding the high temperatures encountered during operation of a thermionic electron emission cathode. In some embodiments, the base may be constructed of a ceramic or glass.

The base may serve as a convenient support for allowing or facilitating connection or installation of the cathode into a suitable device, such as an electron microscope or electron beam lithography tool. In general, the base can be any suitable shape. In some embodiments, the base is a substantially circular disc. In such an embodiment, the other components described below can be connected to one of the faces of the disc.

In some embodiments, the electron emission cathode includes a pair of base pins 102. The base pins may be connected to the base. In some embodiments, the base pins extend beyond a bottom face of the base, the bottom face being an opposite face to a face on which other components described below are connected. The base pins may be particularly advantageous for providing connection between the base and other components of the cathode further described below, such as the sub-base, mounting strips, and/or heat shield. In some embodiments, the base pins are formed from a conductive material. Conductive base pins may be particularly advantageous for providing an electrical connection from a power supply or voltage source which is not part of the cathode to certain portions of the cathode which require electricity, such as the heater. In such an embodiment, one base pin may be connected to a first terminal (e.g., a positive terminal) of a power supply or voltage source and the other base pin may be connected to a second terminal (e.g., a negative terminal) of the power supply or voltage source. A voltage applied between the base pins may be transferred to and provide a voltage difference between other portions of the cathode, such as portions of the heater.

In some preferred embodiments, the base pins are metal. Forming the base pins out of metal may be particularly advantageous for providing electrical connection as described above, as well as convenient construction and attachment of the mounting strips and/or the heat shield supports, as described below. Such attachment may be formed by welding, friction stir welding, spot welding, laser welding, clamping, brazing, soldering with a high-temperature solder, or the like.

In some embodiments, the electron emission cathode includes a sub-base 103. The sub-base may be useful for holding or securing the heater as described below. The sub-base 103 may be constructed of a suitable insulating material. Preferably, the sub-base is constructed of an insulating material that is capable of withstanding the high temperatures encountered during operation of a thermionic electron emission cathode. In some embodiments, the sub-base is constructed of a ceramic or glass. In general, the ceramic or glass used to construct the sub-base may be the same ceramic or glass used to construct the base or may be a different ceramic or glass. The sub-base can have any suitable shape. For example, in the exemplary embodiment depicted in FIGS. 2B and 2D, the sub-base is shown as a short cylinder. This short cylinder has an opening into which the heater is secured. In the exemplary embodiments depicted in FIGS. 2A and 2C, the cathode does not have a sub-base 103.

While the sub-base should be constructed of an insulating material, the sub-base can permit or have suitable structures which form electrical connection between a first terminal of the heater and a first terminal of a power supply or voltage source and a second terminal of the heater and a second terminal of the power supply or voltage source. For example, the sub-base can have suitable metallic components that contact each of the terminals of the heater independently and can connect to the base pins independently. Such metallic components can permit the electrical contact between a terminal of the heater and a base pin without creating a short-circuit. The sub-base may be particularly advantageous for providing and/or enhancing a thermal isolation of the heater from the base, base pins, and/or mounting straps.

In some embodiments, and still referring to FIGS. 2B and 2D, the sub-base is connected to a suitable portion of the base, such as the base pins, by a pair of mounting straps 104. These mounting straps are preferably formed from a conductive material or contain a conductive material that forms an electrical connection between a power supply or voltage source and the heater. Such an electrical connection can include or pass through any suitable components described above, such as the base pins and/or sub-base. In some embodiments, a mounting strap can form an electrical connection that connects one base pin to a terminal of the heater. A second mounting strap can form an electrical connection between the other base pin and the other terminal of the heater, such that a suitable voltage applied between the base pins can be applied to the terminals of the heater. In some embodiments, the mounting straps are formed from or comprise metal and the base pins are formed from or comprise metal. In such embodiments, the mounting straps can be connected to the base pins by welding, friction stir welding, spot welding, laser welding, clamping, brazing, soldering with a high-temperature solder, or the like. Similarly, in some embodiments, the mounting straps are formed from or comprise metal and the sub-base comprises metal. In such embodiments, the mounting straps can be connected to a metal portion of the sub-base by welding, friction stir welding, spot welding, laser welding, clamping, brazing, soldering with a high-temperature solder, or the like. In some embodiments, and referring to FIGS. 2A and 2C, the mounting straps 104 are connected to a suitable portion of the heater 105.

The electron emission cathode includes a heater 105, as shown in FIGS. 2A-2D. In general, the heater can be any suitable type of heater. In some embodiments, the heater is a resistive heater. The resistive heater can be formed from or include a conductive material through which current passes. Such conductive material can take any suitable shape. For example, the conductive material may form a coil, or loop. The coil may be located at or near an end of the heater to which the electron emissive material is connected (a "tip" of the heater). The electron emitter may be disposed within or connected to the coil. In such a situation, the coil itself may support or hold the electron emitter.

A particularly relevant example of a heater is a rod heater, such as a split carbon rod. The rod is divided into two "legs" that are connected at the tip. The tip provides electrical connection between the legs. Each leg may thereby form a terminal of the heater. This shape provides an electrical pathway in which current can flow up one leg, across the tip, and down the other leg. The rod may have any suitable cross-sectional shape. For example, the rod may have a substantially circular cross-section. The cross-section may also be elliptical, square, rectangular, or any other suitable shape. For example, FIGS. 2B and 2D show an embodiment in which the heater is a rod heater. In another example, FIGS. 2A and 2C show and embodiment in which the heater is a pair of wires.

In some embodiments, the heater is mounted in or connected to the sub-base. The connection between the sub-base and the heater may be such that one leg of the heater can be connected to a single conductive portion of the sub-base to form an electrical connection therebetween. The other leg of the heater can be similarly connected to a different conductive portion of the sub-base. This type of connection or mounting can permit a current to flow. That is, in some embodiments, the electrical current can flow from one base pin, through a first mounting strap, through a portion of the sub-base, to a first terminal of the heater (e.g., a first leg), to a tip of the heater, to a second terminal of the heater (e.g., a second leg), though another portion of the sub-base, through a second mounting strap, to a second base pin.

In general, there is no limitation on the size or dimensions of the heater. In some embodiments in which the heater is a rod, the rod has a length of 0.25 mm to 5 mm, or 0.5 mm to 4.5 mm, or 0.75 mm to 4.0 mm, or 1.0 mm to 3.75 mm, or 1.25 mm to 3.5 mm, or 1.5 mm to 3.25 mm. In some embodiments, the rod has a diameter of 0.1 mm to 1 mm, or 0.2 mm to 0.8 mm, or 0.3 mm to 0.7 mm, or 0.4 mm to 0.6 mm, or about 0.5 mm. Such a diameter may refer to a mean diameter, a minimum diameter, or a maximum diameter. For example, if the rod tapers, the indicated diameter may be the mean diameter of the rod across an entirety of the rod length, a minimum diameter, or a maximum diameter. In an embodiment where the rod has an asymmetric cross-sectional shape, such as an ellipse, the diameter can refer to a major axis length, a minor axis length, or a mean of the major axis length and the minor axis length.

In some embodiments, the heater is formed from or disposed in an entirety of the length of the rod. In some embodiments, the heater is formed in or disposed in the tip of the rod.

Figure 3:
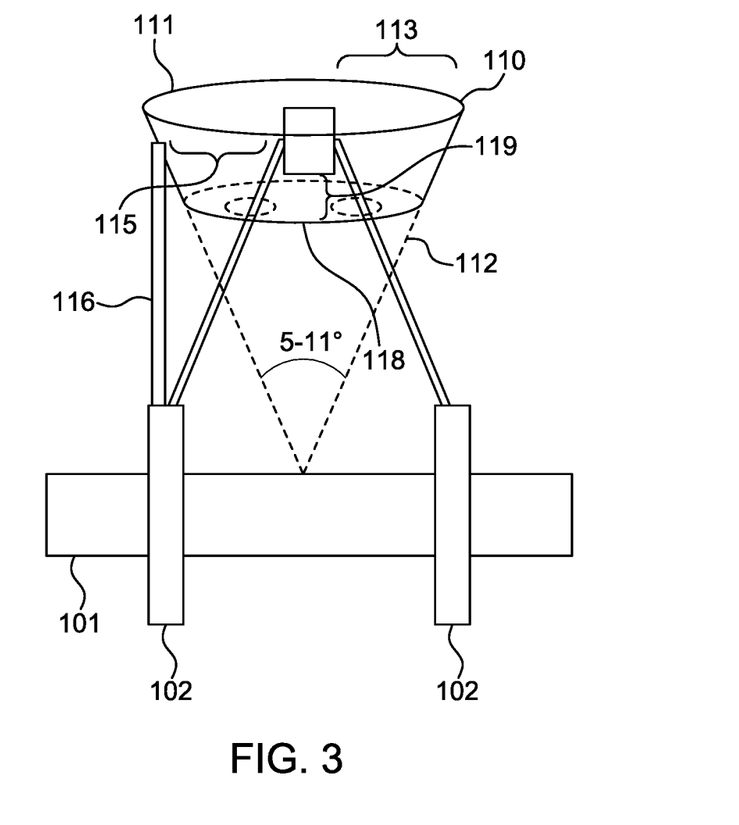
FIG. 3 shows an electron emission cathode according to an exemplary embodiment of the present disclosure with the conical heat shield in place.

In some embodiments, the cathode does not contain a sub-base. In such embodiments, the heater can be connected directly to the mounting straps or directly to the base pins. Such embodiments may be particularly applicable to "filament"-type electron emitters or cathodes. Such embodiments may also or alternatively be particularly applicable to embodiments that use non-rod-type heaters, such as Vogel mount heaters or ring-mount heaters. An example of such an embodiment is depicted in FIG. 3.

A Vogel mount heater typically secures the electron emitter between substantially flat sections of heater material. For example, the electron emitter may be pinched between flat blocks or plates of heater material. Ring-mount heaters typically secure the electron emitter with a suitably shaped ring or other closed shape of heater material.

The electron emission cathode includes an electron emitter 107. The electron emitter is mounted or disposed on the heater at or near the tip. That is, the electron emitter is placed distal from the base.

In general, the electron emitter may contain or be formed from any suitable electron emissive material. Preferably, the electron emissive material is capable of withstanding high temperature (for example, has a high melting point), has low evaporation rate, and has a low work function. Examples of suitable materials that may form or be included in the electron emitter include, but are not limited to tungsten, thoriated tungsten, barium oxide, lanthanum hexaboride, and cerium hexaboride. Of particular relevance to the present disclosure are electron emitters formed from crystalline lanthanum hexaboride ($LaB_6$).

The $LaB_6$ or other suitable crystalline material (such as cerium hexaboride) may be in the form of a crystal body. The crystal body may be of any suitable, convenient, and useful shape. In some embodiments, the crystal body is cylindrical with a circular cross-section and a diameter in the range of about 20 µm to about 800 µm. Alternatively, the shape may be a rectangular solid with a rectangular cross section, in which a diagonal of the rectangle is in the range of about 400 µm to about 1,600 µm. The choice of crystal body shape and size will generally depend on the particular cathode application (including but not limited to SEM, TEM, lithography tool, probe, free electron laser, electron and ion guns, etc.) and the type of heater employed. For example, a Vogel mount heater typically requires a rectangular crystal body shape (see, e.g., Vogel, S. F. Rev. Sci. Instr., 41, 585, 1970) and a coaxial heater (e.g., a carbon rod heater or a ring-mount heater) typically requires a cylindrical crystal body shape (see, e.g., Hohn, F. et al., J. AppL. Phys., 53(3), March 1982).

The electron emitter may be of any suitable shape. In some embodiments, the electron emitter is generally cylindrical or substantially cylindrical in shape, having straight sides which may be coated with a carbon coating. The length of the emitter body generally ranges from about 0.50 mm to about 3 mm. In some embodiments, the electron emitter has a cross-section that is generally round or rectangular, with a diameter (or width, if a rectangle) in the range of from about 20 µm to about 800 µm.

In some embodiments, an end of the electron emitter (e.g., the emitter tip) may be flat, pointed (e.g., cone-shaped or prismatic) or curved (e.g. spherical or dome-shaped). The diameter of the tip is generally in the range of from about 5 µm to about 1500 µm, and preferably in the range of from about 5 µm to about 1400 µm. In some embodiments, an upper section of the electron emitter, e.g., about the upper 50 µm to 200 µm of the electron emitter, may generally be conical in shape, with a cone angle in the range of from about 20 degrees to about 90 degrees and is preferably in the range from about 60 degrees to about 90 degrees. In some embodiments, the cone angle is 60 degrees.

The shape and size of the electron emitter may impact cathode maximum brightness and maximum emission current available. The selection of a particular size will be based largely on the particular application of the cathode. For example, for a SEM, high brightness but small emission current is needed, so a tip size of about 5 µm may be optimal. In lithography tools, medium brightness and high emission current are required, so a tip of 50 µm size or greater may be optimal. As the present disclosure is not limited to a specific application, there is no specific limitation on the size of the electron emitter that may be used.

In some embodiments, the electron emitter 107 can be connected to the heater 105 through the use of a suitable connector 106, e.g., as shown in FIG. 2A. The connector is preferably a thermally conductive material. The connector may or may not be electrically conductive.

The electron emission cathode also comprises a conical heat shield 110, e.g., as shown in FIGS. 2C and 2D. The conical heat shield surrounds a portion of the heater. In some embodiments, the conical heat shield surrounds a majority (i.e., greater than 50% of length) of the heater. Such a majority can be, for example, a majority of the length of the heater or a majority of the mass of the heater. The conical heat shield serves to reflect heat radiated outward from the heater lower- and mid-sections back toward the upper section heater and the electron emitter. In order to achieve a directional reflection of such outwardly radiated heat, the conical heat shield has a truncated cone shape comprising a wide end 111 disposed closer to the electron emitter and a narrow end 112 disposed closer to the base. This orientation of the cone shape serves to direct the reflection of heat radiated by the heater away from the base and toward the electron emitter.

The conical heat shield can be mounted or connected to any suitable part of the electron emission cathode. For example, the conical heat shield can be mounted on or connected to the base, the base pin(s), the mounting straps, or the sub-base. In some embodiments, the conical heat shield is mounted on or connected to the base pin(s) and/or mounting strap(s). In some embodiments, the heat shield is mounted to one or both of the base pins using one or more heat shield supports 116. In general, the heat shield supports can be constructed of a metal, such as the same metal of the heat shield itself or a similar metal to the base pin or mounting strap. The base pin(s) are typically constructed of metal. Preferably, the base pins are constructed from a metal with low emissivity, such as tantalum or a titanium-zirconium-molybdenum alloy (TZM). Such construction can be advantageous for allowing the heat shield to be mounted to one or both of the base pins using one or more heat shield supports 116. When a heat shield support is formed from a metal, the heat shield support 116 can be connected to the base pin and/or mounting strap by welding, friction stir welding, spot welding, laser welding, clamping, brazing, soldering with a high-temperature solder, or the like. This may be particularly advantageous for easy or convenient construction of the electron emission cathode. Further, this may be advantageous for allowing or facilitating replacement of the heat shield.

For example, FIGS. 2C-2D depict an exemplary embodiment in which the conical heat shield 110 is mounted to two base pins using a pair of heat shield supports. In such an embodiment, when the heat shield supports are conductive (e.g., made of metal), current must be prevented from flowing between the base pins via the heat shield and heat shield supports. As the base pins carry a voltage difference, a circuit may be formed through the heat shield and heat shield supports when those components are formed from metal. A suitable current break 117 may therefore be included in one or more of the heat shield supports to prevent such electrical current from flowing. The current break can be formed from a suitable insulating material, such as a ceramic or glass. The current break can be disposed at any portion of the heat shield support. Preferably, the current break is positioned proximal to the base pin or mounting strap. This may be advantageous for limiting a maximum temperature reached by the current break. A lower maximum temperature reached may increase the performance or lifetime of the current break.

FIG. 3 depicts an exemplary embodiment in which the heat shield is mounted to one base pin using one heat shield support. In some embodiments in which only one heat shield support is used, a current break may be included. Alternatively, because no complete circuit is completed, the current break may be omitted.

In some embodiments, the conical heat shield has a cone angle of 2 degrees to 15 degrees, preferably 3 degrees to 14 degrees, preferably 4 degrees to 13 degrees, preferably 4.5 degrees to 12 degrees, preferably 5 degrees to 11 degrees. This range of cone angles may be particularly advantageous for achieving desired reflection and direction of heat radiated by the heater toward the electron emitter. This range of cone angles may represent an optimal range for concentration of the reflected heat at the electron emitter and smoothing over heater hot spot. This optimal range may lead to or be associated with an optimum efficiency of the conical heat shield.

In some embodiments, the electron emission cathode has a separation distance between an inner surface of the conical heat shield and the heater of 250 µm to 1000 µm, preferably 300 µm to 975 µm, preferably 350 µm to 950 µm, preferably 375 µm to 925 µm, preferably 400 µm to 900 µm, preferably 425 µm to 875 µm, preferably 450 µm to 850 µm, preferably 475 µm to 825 µm, preferably 500 µm to 800 µm. This separation distance may refer to a wide end separation distance 113, a narrow end separation distance 114, a midpoint separation distance 115 (e.g., a separation distance at a midpoint along a length of the conical heat shield), as shown in FIGS. 2C-2D, or a mean separation distance.

In some embodiments, the conical heat shield has a wide end separation distance 113 less than 1000 µm, preferably less than 975 µm, preferably less than 950 µm, preferably less than 925 µm, preferably less than 900 µm, preferably less than 875 µm, preferably less than 850 µm, preferably less than 825 µm, preferably less than 810 µm, preferably about 800 µm. This wide end separation distance may be advantageous for ensuring that sufficient heat is reflected back toward the electron emitter. However, an even larger separation distance may result in decreased efficiency of the heat shield and may therefore be undesirable.

In some embodiments, the conical heat shield has a narrow end separation distance 114 greater than 250 µm, preferably greater than 275 µm, preferably greater than 300 µm, preferably greater than 325 µm, preferably greater than 350 µm, preferably greater than 375 µm, preferably greater than 400 µm, preferably greater than 425 µm, preferably greater than 450 µm, preferably greater than 475 µm, preferably greater than 490 µm, preferably about 500 µm. This narrow end separation distance may be advantageous for preventing inadvertent contact between the conical heat shield and other portions of the electron emission cathode, such as the carbon rod, heater, sub-base, mounting strips, or the like. Such contact may result in damage to one of those other portions, damage to the conical heat shield, or a short-circuit. Such damage or short-circuit may be particularly disadvantageous for operation of the electron emission cathode.

In some embodiments, the conical heat shield comprises a bottom plate 118. An example of such an embodiment is shown in FIG. 3. This bottom plate may be particularly relevant in filament-type emitters or cathodes or with heater types that are not rod heaters. The use of such a bottom plate, however, is not precluded by a rod heater.

The bottom plate 118 can have suitable openings through which the legs or terminals of the heater pass. Alternatively, the mounting strips can pass through such suitable openings. The bottom plate can in general have any suitable number of openings. For example, two openings may be useful for embodiments such as the one depicted in FIG. 3. In another example, one opening may be useful in embodiments that comprise a rod heater, such as the one depicted in FIG. 2D.

In some embodiments, the bottom plate 118 has a separation distance 119 between an upper surface of the bottom plate and the heater of 250 µm to 1000 µm, preferably 300 µm to 975 µm, preferably 350 µm to 950 µm, preferably 375 µm to 925 µm, preferably 400 µm to 900 µm, preferably 425 µm to 875 µm, preferably 450 µm to 850 µm, preferably 475 µm to 825 µm, preferably 500 µm to 800 µm.

In some embodiments, the conical heat shield is oriented such that the heater is substantially concentric with the conical heat shield. That is, the heater is positioned in a center of a lateral extent of the conical heat shield. Such a lateral extent may be a width, a length, or both. This may be particularly advantageous for ensuring even heat distribution about a circumference or exterior of the heater and/or electron emitter. An off-center placement may lead to disadvantageous asymmetric heat distribution, such as hotspots.

Figure 4A:
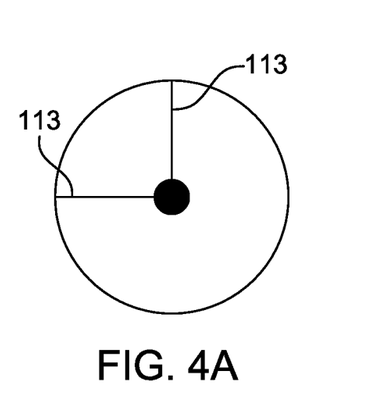
FIGS. 4A-4F show a top-down view of examples of conical heat shields and heaters having different cross-sectional shapes according to exemplary embodiments of the present disclosure.
Figure 4B:
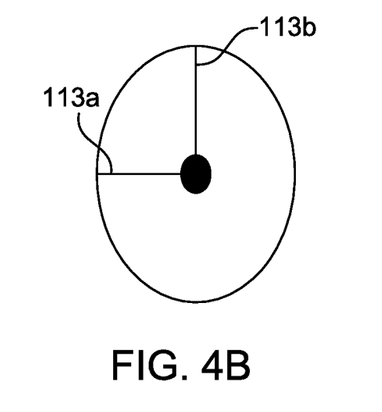
Figure 4C:
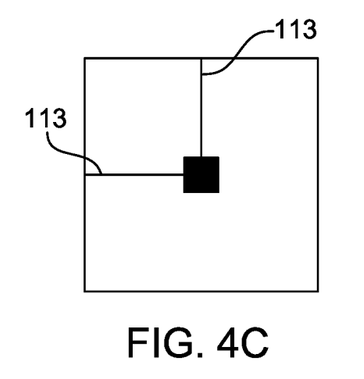
Figure 4D:
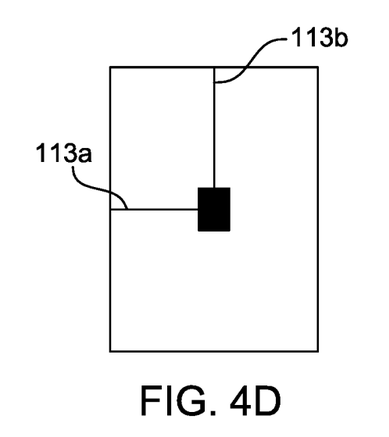

In general, the conical heat shield may have any suitable cross-sectional shape. In some embodiments, the conical heat shield has a cross-sectional shape that is the same as a cross-sectional shape of the heater. For example, when the heater is a rod heater having a circular cross-section, the conical heat shield may have a circular cross-section. A top-down view of an example of such an embodiment is depicted in FIG. 4A. Only a single wide end separation distance 113 is present. Similarly, if the heater has an elliptical cross-section, the conical heat shield may have an elliptical cross section. Preferably, in such embodiments, the elliptical cross-section of the conical heat shield is aligned with the elliptical cross-section of the heater. That is, the major axes of both ellipses are aligned with each other. In such an embodiment, the ellipses may have the same aspect ratio or may have different aspect ratios. A top-down view of an example of such an embodiment is depicted in FIG. 4B. Two wide end separation distances are depicted, a first wide end separation distance 113a is shown between the heater and the closer portion of the elliptical cross-section of the conical heat shield corresponding to the semi-minor axis and a second wide end separation distance 113b is shown between the heater and the farther portion of the elliptical cross-section of the conical heat shield corresponding to the semi-major axis. In another example, when the heater has a square cross-section, the conical heat shield may have a square cross-section. A top-down view of an example of such an embodiment is depicted in FIG. 4C. Only a single wide end separation distance 113 is present. In another example, when the heater has a rectangular cross-section, the conical heat shield may have a rectangular cross-section. The rectangles may be aligned with each other. That is, a longitudinal dimension of the rectangular cross-section of the heater may be aligned with a long dimension of the rectangular cross-section of the conical heat shield. The rectangles may have the same aspect ratio or different aspect ratios. A top-down view of an example of such an embodiment is depicted in FIG. 4D. Two wide end separation distances are depicted, a first wide end separation distance 113a is shown between the heater and the closer edge of the rectangular cross-section of the conical heat shield and a second wide end separation distance 113b is shown between the heater and the farther edge of the rectangular cross-section of the conical heat shield.

Figure 4E:
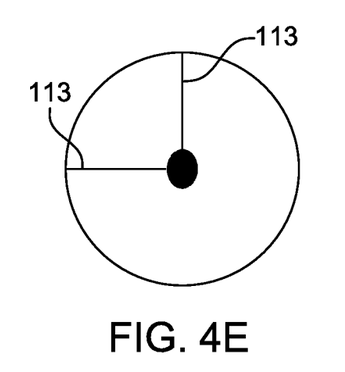
Figure 4F:
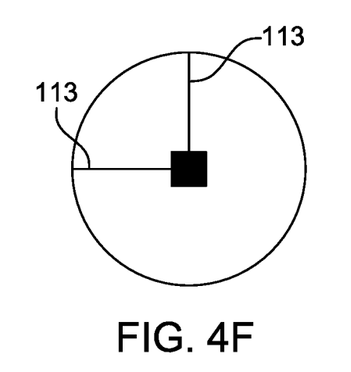

In some embodiments, the conical heat shield may have a cross-sectional shape that is not the same as the cross-sectional shape of the heater. In some embodiments, the conical heat shield may have a cross-sectional shape that is circular. Such a circular cross-section may be used regardless of the cross-sectional shape of the heater. A top-down view of an example of an embodiment in which the conical heat shield has a circular cross-section and the heater has an elliptical cross-section is depicted in FIG. 4E. A top-down view of an example of an embodiment in which the conical heat shield has a circular cross-section and the heater has a square cross-section is depicted in FIG. 4F.

In general, there is no specific limit on a height of the conical heat shield. Preferably, the conical heat shield is positioned such that it does not extend past the electron emitter. The cathode is frequently used in devices, such as electron microscopes and electron beam lithographs, which typically have other hardware that extends beyond but in close proximity to the electron emitter. For example, a Wehnelt cylinder may be positioned around the electron emitter. This cylinder may be kept at a high potential for purposes such as accelerating, steering, or shaping a beam of electrons emitted from the cathode. Contact or sufficiently close approach between the conical heat shield and the Wehnelt cylinder may cause discharge or short-circuiting, which may damage the cathode, the Wehnelt cylinder, or other portions of the device. By ensuring that the conical heat shield does not extend past the electron emitter, such contact or short-circuiting may be avoided.

In some embodiments, the conical heat shield does not extend to the electron emitter. In such embodiments, the conical heat shield may extend to the same height as the heater. That is, the conical heat shield is oriented such that a maximum height of the conical heat shield is substantially even with a maximum height of the heater. This may create or increase a safety margin of physical separation between the conical heat shield and other components, such as the Wehnelt cylinder. This safety margin may be useful for ensuring that such other components are not exposed to or damaged by heat from the conical heat shield or damaged by contact with the heat shield.

The conical heat shield is preferably constructed from a material having a high reflectivity and a low emissivity. The material should also be compatible with the high temperatures reached by the heater. For example, nickel or stainless steel are typically not suitable for use due to a lower melting point. In some embodiments, the conical heat shield is formed from a material selected from the group consisting of tantalum and a titanium zirconium molybdenum (TZM) alloy. TZM has a higher recrystallization temperature, higher creep strength, and higher tensile strength than pure, unalloyed molybdenum. In general, the TZM alloy can have any suitable composition. Typical TZM alloys contains 0.5% to 2% titanium, 0.08% to 2% zirconium, optionally 0.02% carbon, and the balance molybdenum. One example of a TZM alloy contains ~1% titanium, ~1% zirconium, and the balance molybdenum.

As described above, the conical heat shield is positioned and shaped to reflect heat radiated by the heater back to the heater and directed toward the electron emitter (and therefore away from the base). To facilitate this reflection, in some embodiments, an inner surface of the conical heat shield may be polished. Such polishing may increase reflectivity. Increased reflectivity may increase the efficiency of the conical heat shield. Similarly, in some embodiments an upper surface of the bottom plate may be polished. In some embodiments, an outer surface of the conical heat shield may be polished. Similarly, in some embodiments a lower surface of the bottom plate may be polished. In preferred embodiments, both inner and outer surfaces of the conical heat shield may be polished. Such polishing may be advantageous to improve reflectivity and reduce heat shield outer surface thermal radiation loss.

The presence of the heat shield can be advantageous for reducing the overheating of the heater in order to heat the electron emitter to the desired emission temperature. This reduction in overheating can decrease wear on various components of the cathode and can protect or decrease wear on other components of the device, particularly those in proximity to the heater.

Figure 5:
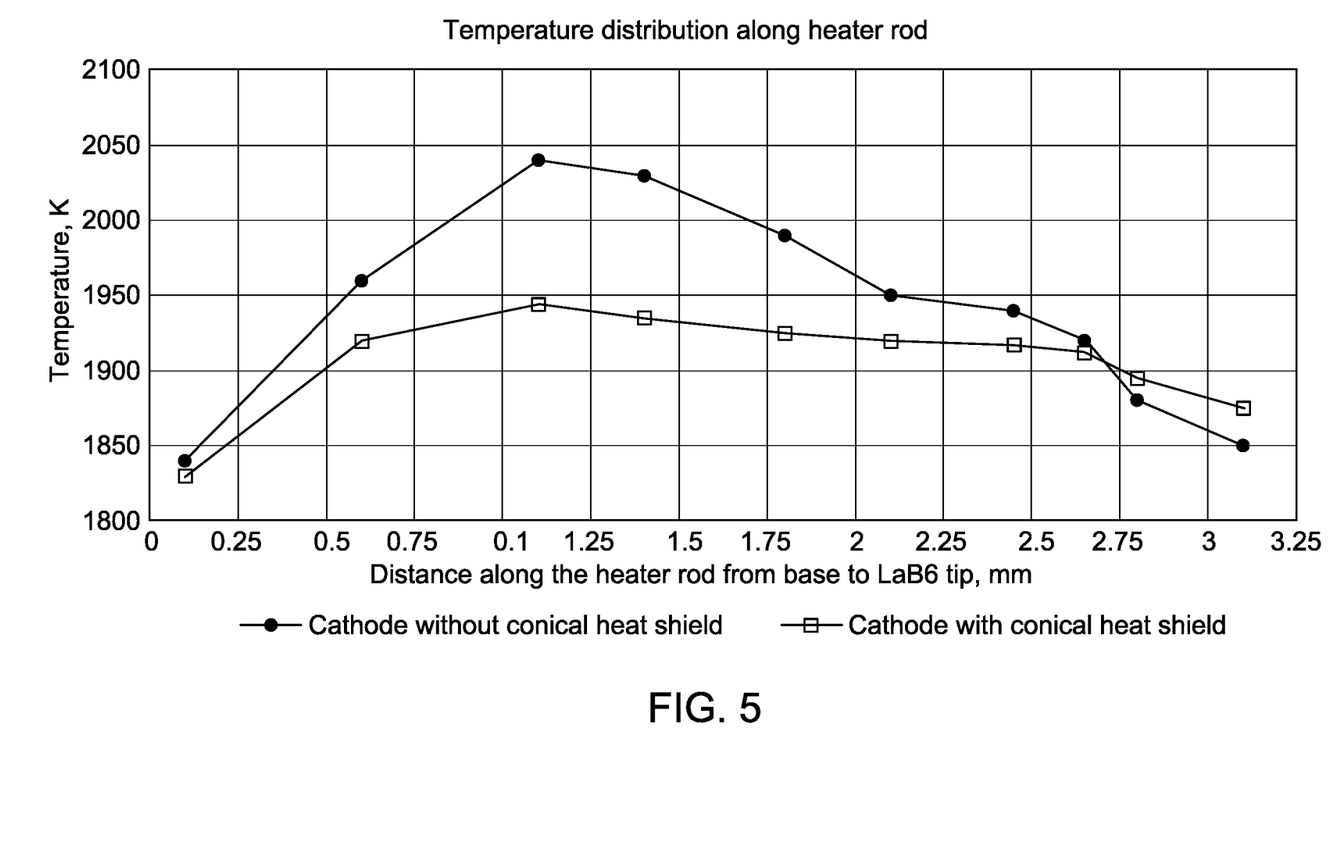
FIG. 5 shows a comparison of the temperature profile along a length direction of the heater and electron emitter for a conventional thermionic electron emission cathode lacking the conical heat shield and an exemplary thermionic electron emission cathode having the conical heat shield, according to exemplary embodiments of the present disclosure.

In some embodiments, the electron emission cathode of the present disclosure is configured to operate with a temperature difference between the heater and the electron emitter of less than 150 K, preferably less than 140 K, preferably less than 130 K, preferably less than 120 K, preferably less than 110 K, preferably less than 105 K, preferably less than 100 K, preferably less than 95 K, preferably less than 90 K, preferably less than 85 K, preferably less than 80 K, preferably less than 75 K, preferably less than 70 K, preferably less than 65 K, preferably less than 60 K, preferably less than 55 K, preferably less than 50 K. This represents a distinct advantage over conventional cathodes lacking the conical heat shield, which typically operate with a temperature difference between the heater and the electron emitter of at least 200 K. An example of the heat distribution of such a conventional cathode is shown in FIG. 1B. A comparison of the heat distribution of a cathode lacking the conical heat shield and a cathode having the conical heat shield is shown in FIG. 5. The temperatures used to generate FIG. 5 were measured by pyrometer. It is clear from this comparison that the maximum heater temperature is reduced, there is a much more uniform temperature distribution along the length of the heater, and there is a smaller difference in temperature between the heater hot spot and the electron emitter.

An advantage of the cathode of the present disclosure over conventional cathodes is that the presence of the heat shield can increase cathode lifetime. In some embodiments, a cathode having the described conical heat shield has a cathode lifetime which is 110% to 150%, preferably 112.5% to 147.5%, preferably 115% to 145%, preferably 117.5% to 142.5%, preferably 120% to 140%, preferably 122.5% to 137.5%, preferably 125% to 135%, preferably 127.5% to 132.5%, preferably 129% to 131%, preferably about 130% of a cathode lifetime of an electron emission cathode lacking the conical heat shield.

An advantage of the cathode of the present disclosure over conventional cathodes is a heating power that is less than 95%, preferably less than 92.5%, preferably less than 90%, preferably less than 89% of a heating power of an electron emission cathode lacking the conical heat shield. For example, a cathode lacking the conical heat shield may operate with a heating power of ~9 W to 13 W. The inclusion of the conical heat shield may, in some embodiments, reduce the heating power by at least 0.75 W, preferably at least 0.80 W, preferably at least 0.85 W, preferably at least 0.90 W, preferably at least 0.95 W, preferably at least 1.00 W, preferably at least 1.05 W, preferably at least 1.10 W.

The present disclosure also relates to a method of forming an electron beam using the electron emission cathode. The method involves applying a voltage to the heater to cause the electron emitter to be heated to an emission temperature at which electrons are emitted. Typically, the voltage is in a range of 0.5 V to 5 V, preferably 0.75 V to 4 V, preferably 1 V to 3 V. In preferred embodiments, a maximum heater temperature required to heat the electron emitter to the emission temperature is reduced by at least 50 K, preferably at least 60 K, preferably at least 70 K, preferably at least 80 K, preferably at least 90 K, preferably at least 100 K, preferably at least 110 K, preferably at least 120 K, preferably at least 125 K, preferably at least 130 K, preferably at least 135 K, preferably at least 140 K, preferably at least 145

K, preferably at least 150 K compared to an electron emission cathode lacking the conical heat shield.

In some embodiments, the method has a heating power that is less than 95%, preferably less than 92.5%, preferably less than 90%, preferably less than 89% of a heating power of an electron emission cathode lacking the conical heat shield. For example, a cathode lacking the conical heat shield may operate with a heating power of ~9 W to 13 W. The inclusion of the conical heat shield may, in some embodiments, reduce the heating power by at least 0.75 W, preferably at least 0.80 W, preferably at least 0.85 W, preferably at least 0.90 W, preferably at least 0.95 W, preferably at least 1.00 W, preferably at least 1.05 W, preferably at least 1.10 W.

In some embodiments, the method may involve the heater being heated to a temperature less than 150 K, preferably less than 140 K, preferably less than 130 K, preferably less than 120 K, preferably less than 110 K, preferably less than 105 K, preferably less than 100 K, preferably less than 95 K, preferably less than 90 K, preferably less than 85 K, preferably less than 80 K, preferably less than 75 K, preferably less than 70 K, preferably less than 65 K, preferably less than 60 K, preferably less than 55 K, preferably less than 50 K greater than the emission temperature.

Embodiments of the present disclosure may also be as set forth in the following parentheticals.

(1) An electron emission cathode, comprising a base, a heater connected to the base, an electron emitter connected to the heater at a mounting location distal to the base, and a conical heat shield surrounding a portion of the heater, having a truncated cone shape comprising a narrow end oriented toward the base and a wide end oriented toward the electron emitter.

(2) The electron emission cathode of (1), wherein the electron emitter is formed from a material selected from the group consisting of tungsten, thoriated tungsten, barium oxide, lanthanum hexaboride, and cerium hexaboride.

(3) The electron emission cathode of any one of (1) to (2), wherein the base comprises a pair of base pins and the heater is connected to the base through the pair of base pins.

(4) The electron emission cathode of (3), wherein the conical heat shield is connected to one or both of the base pins.

(5) The electron emission cathode of any one of (3) to (4), wherein the conical heat shield is connected to both base pins such that no current can flow between the base pins through the conical heat shield.

(6) The electron emission cathode of (5), wherein a connection between the conical heat shield and a base pin comprises a current break formed from a glass or a ceramic.

(7) The electron emission cathode of any one of (1) to (6), wherein the conical heat shield has a cone angle of 2 degrees to 15 degrees.

(8) The electron emission cathode of any one of (1) to (7), having a separation distance between an inner surface of the conical heat shield and the heater of 250 μm to 1000 μm.

(9) The electron emission cathode of any one of (1) to (8), wherein the conical heat shield is formed from a material selected from the group consisting of tantalum and a titanium zirconium molybdenum (TZM) alloy.

(10) The electron emission cathode of any one of (1) to (9), wherein the conical heat shield is positioned such that it does not extend past the electron emitter.

(11) The electron emission cathode of any one of (1) to (10), wherein the conical heat shield is oriented a maximum height of the conical heat shield is substantially even with a maximum height of the heater.

(12) The electron emission cathode of any one of (1) to (11), wherein the conical heat shield is oriented such that the heater is substantially concentric with the conical heat shield.

(13) The electron emission cathode of any one of (1) to (12), wherein the conical heat shield has a cross-sectional shape that is the same as a cross-sectional shape of the heater.

(14) The electron emission cathode of any one of (1) to (13), wherein the conical heat shield has a circular cross-sectional shape.

(15) The electron emission cathode of any one of (1) to (14), wherein the conical heat shield is configured to reflect heat generated by the heater toward the electron emitter.

(16) The electron emission cathode of any one of (1) to (15), wherein the cathode lifetime is 110% to 150% of a cathode lifetime of an electron emission cathode lacking the conical heat shield.

(17) The electron emission cathode of any one of (1) to (16), the cathode being configured to operate with a temperature difference between the heater and the electron emitter of less than 150 K.

(18) A method of forming an electron beam using the electron emission cathode of any one of (1) to (17), the method comprising applying a voltage to the heater to cause the electron emitter to be heated to an emission temperature at which electrons are emitted, wherein a maximum heater temperature required to heat the electron emitter to the emission temperature is reduced by at least 100 K compared to an electron emission cathode lacking the conical heat shield.

(19) The method of (18), wherein a heating power of the heater is less than 95% of a heating power of an electron emission cathode lacking the conical heat shield.

(20) The method of any one of (18) to (19), wherein the heater is heated to a temperature less than 100 K greater than the emission temperature.

Numerous modifications and variations of the present invention are possible in light of the above teachings. It is therefore to be understood that within the scope of the appended claims, the invention may be practiced otherwise than as specifically described herein.

The invention claimed is:

1. An electron emission cathode, comprising:
a base;
a heater connected to the base;
an electron emitter connected to the heater at a mounting location distal to the base; and
a conical heat shield surrounding a portion of the heater, having a truncated cone shape comprising a narrow end oriented toward the base and a wide end oriented toward the electron emitter.

2. The electron emission cathode of claim 1, wherein the electron emitter is formed from a material selected from the group consisting of tungsten, thoriated tungsten, barium oxide, lanthanum hexaboride, and cerium hexaboride.

3. The electron emission cathode of claim 1, wherein the base comprises a pair of base pins and the heater is connected to the base through the pair of base pins.

4. The electron emission cathode of claim 3, wherein the conical heat shield is connected to one or both of the base pins.

5. The electron emission cathode of claim 3, wherein the conical heat shield is connected to both base pins such that no current can flow between the base pins through the conical heat shield.

6. The electron emission cathode of claim 5, wherein a connection between the conical heat shield and a base pin comprises a current break formed from a glass or a ceramic.

7. The electron emission cathode of claim 1, wherein the conical heat shield has a cone angle of 2 degrees to 15 degrees.

8. The electron emission cathode of claim 1, having a separation distance between an inner surface of the conical heat shield and the heater of 250 µm to 1000 µm.

9. The electron emission cathode of claim 1, wherein the conical heat shield is formed from a material selected from the group consisting of tantalum and a titanium zirconium molybdenum (TZM) alloy.

10. The electron emission cathode of claim 1, wherein the conical heat shield is positioned such that it does not extend past the electron emitter.

11. The electron emission cathode of claim 1, wherein the conical heat shield is oriented such that a maximum height of the conical heat shield is substantially even with a maximum height of the heater.

12. The electron emission cathode of claim 1, wherein the conical heat shield is oriented such that the heater is substantially concentric with the conical heat shield.

13. The electron emission cathode of claim 1, wherein the conical heat shield has a cross-sectional shape that is the same as a cross-sectional shape of the heater.

14. The electron emission cathode of claim 1, wherein the conical heat shield has a circular cross-sectional shape.

15. The electron emission cathode of claim 1, wherein the conical heat shield is configured to reflect heat generated by the heater toward the electron emitter.

16. The electron emission cathode of claim 1, wherein the cathode lifetime is 110% to 150% of a cathode lifetime of an electron emission cathode lacking the conical heat shield.

17. The electron emission cathode of claim 1, the cathode being configured to operate with a temperature difference between the heater and the electron emitter of less than 150 K.

18. A method of forming an electron beam using the electron emission cathode of claim 1, the method comprising:
    applying a voltage to the heater to cause the electron emitter to be heated to an emission temperature at which electrons are emitted,
    wherein a maximum heater temperature required to heat the electron emitter to the emission temperature is reduced by at least 100 K compared to an electron emission cathode lacking the conical heat shield.

19. The method of claim 18, wherein a heating power of the heater is less than 95% of a heating power of an electron emission cathode lacking the conical heat shield.

20. The method of claim 18, wherein the heater is heated to a temperature less than 100 K greater than the emission temperature.

* * * * *